United States Patent [19]

Hoda et al.

[11] Patent Number: 4,559,264
[45] Date of Patent: Dec. 17, 1985

[54] SYNTHETIC MICA PRODUCTS

[75] Inventors: Syed N. Hoda, Horseheads; Anthony R. Olszewski, Bath, both of N.Y.

[73] Assignee: Corning Glass Works, Corning, N.Y.

[21] Appl. No.: 461,566

[22] Filed: Jan. 27, 1983

[51] Int. Cl.$^4$ .................. B32B 19/00; B32B 27/38
[52] U.S. Cl. ................................ 428/324; 428/415; 428/449; 428/454; 428/901; 428/689; 428/363; 174/68.5
[58] Field of Search ............... 428/901, 454, 415, 324, 428/449, 689

[56] References Cited

U.S. PATENT DOCUMENTS

| | | | |
|---|---|---|---|
| 4,239,519 | 12/1980 | Beall et al. | 264/212 X |
| 4,335,367 | 6/1982 | Mitsui et al. | 428/454 |
| 4,336,302 | 6/1982 | Ihlein | 428/454 |
| 4,360,570 | 11/1982 | Andreades et al. | 428/901 X |

Primary Examiner—P. C. Ives
Attorney, Agent, or Firm—C. S. Janes, Jr.

[57] ABSTRACT

There are disclosed synthetic mica papers, substrates produced by laminating such papers, and use of the substrates in printed circuit assemblies. The mica paper is composed primarily of overlapping, ion-exchanged platelets of a synthetic, lithium and/or sodium, water-swelling mica, and is impregnated with an organic resin.

17 Claims, No Drawings

SYNTHETIC MICA PRODUCTS

BACKGROUND OF THE INVENTION

This invention relates to a sheet of mica paper composed primarily of synthetic mica platelets impregnated with an organic resin. In a particular embodiment, a plurality of such impregnated sheets are stacked and consolidated to form a laminated board or flexible substrate for a printed circuit. The board may function as a substrate for a printed circuit assembly in which chip carriers and other components are mounted or printed on the substrate. The substrate may also be provided with conductive connections by subtractive or additive circuitry processes.

Sheets of paper may be produced from a variety of different materials. A material is first suspended in liquid as chopped fibers or as a comminuted powder. This forms a slurry or pulp which is then passed through paper making apparatus. Best known are the cellulose papers produced from wood and/or cloth pulps. Where special electrical properties and/or thermal resistance are required, such papers are generally ineffective.

Consequently, considerable effort has been expended in developing papers based on inorganic materials. As reported by the Bureau of Mines in Bulletin 647(1969), entitled "Fluorine Micas", both natural and synthetic micas have been explored at considerable length. See particularly pages 214–242 of bulletin.

Such inorganic papers are produced on a commercial basis, but have never quite fulfilled their promise. Rather, papers and boards presently used for electrical purposes, e.g., component insulation, transformer wrapping and circuit substrates, are largely organics containing fiber fillers and/or fabric reinforcement. Where high temperature substrates are required, sintered ceramics such as alumina are commonly used.

The electrical characteristics or properties required in an electrical material will vary with the application. For example, presently available circuit assembly substrates may provide a low dielectric constant (K) in the range of 4 to 5.5, a dissipation factor less than 0.05, dielectric strength of at least 700 V/mil and volume resistivity of at least 1.0 megohms $\times 10^6$. In addition, the material should have a flexural strength of at least 10,000 psi, be non-flammable, and be resistant to processing chemicals and to moisture pickup.

Thermal expansion characteristics become important where surface mounting of leadless ceramic chip carriers is required. A particular problem has arisen in many presently available substrates because of high thermal expansion mismatch as well as highly anisotropic expansion coefficients. This means that the actual values of the coefficients along the three axes of a board may vary widely. This is generally believed to result from material orientation and/or tensions introduced by fabrics, such as glass cloth.

PURPOSES OF THE INVENTION

A basic purpose is to produce improved electrical products.

A further purpose is to provide such improved products embodying synthetic mica materials.

Another purpose is to utilize known water-swelling, ion-exchanged, synthetic micas as a basis for such electrical products.

A particular purpose is to provide impregnated, synthetic mica papers that can be stacked and consolidated to produce a laminated substrate.

A specific purpose is to provide a synthetic mica, laminated substrate having an isotropic thermal coefficient of expansion in the X-Y plane, such coefficient preferably being below $100 \times 10^{-7}/°C$.

A further specific purpose is to provide synthetic mica papers having acceptable electrical properties including a dielectric constant in the range of 4 to 5.5, a dissipation factor less than 0.05, dielectric strength of at least 700 V/mil and volume resistivity of at least 1.0 megohms $\times 10^6$.

A still further specific purpose is to produce a laminated substrate having a flexural strength of at least 10,000 psi.

SUMMARY OF THE INVENTION

In accomplishment of these purposes, and others that will be apparent, our invention is embodied in a novel synthetic mica paper, in a flexible or rigid substrate produced from such papers, and in a printed circuit assembly employing such substrate.

The mica paper is composed primarily of overlapping, ion-exchanged platelets of a synthetic, lithium and/or sodium, water-swelling mica wherein lithium and/or sodium ions from the mica are exchanged for larger cations, the paper is impregnated with an organic resin, and a stack of laminated papers has a planar isotropic coefficient of thermal expansion in the X-Y plane.

The preferred resin is an epoxy which constitutes at least 15% by weight of the composite. Amounts of resin up to about 75% may be employed in special laminae, but a range of 20–50% is preferred. It is also preferred to employ a hectorite type mica in which lithium ions have been exchanged for potassium ions to form a potassium-ion-exchanged floc.

Board is made from impregnated papers by stacking several layers, and then applying heat and pressure to consolidate the papers into an integral, laminated body. A standard board thickness of 60 mils may be formed, e.g., from 10–15 sheets of paper, depending on paper thickness. The board is characterized by an isotropic coefficient of thermal expansion which may be as low as $65 \times 10^{-7}/°C.$, is normally less than a hundred units and is preferably 65 to $80 \times 10^{-7}/°C$.

In a specific embodiment, the board is a substrate in a printed circuit assembly. The board may have one or more ceramic chip carriers, e.g., sintered alumina, or other electrical components, mounted on its surface. Further, it may have conducting circuitry applied by additive and/or subtractive techniques. Also, to provide reinforcement and/or to improve circuitry adhesion, the synthetic mica paper may on occasion be layered with glass fabric. Finally, a thin substrate may be employed as a flexible circuit substrate.

RELATED LITERATURE

U.S. Pat. No. 4,239,519 discloses glass-ceramics composed predominantly or completely of synthetic, lithium and/or sodium mica crystals, the formation of gels from such glass-ceramics, and the use of such gels in forming films, papers, boards and other products.

As earlier noted, Bulletin 647 (1969) of the Bureau of Mines, is entitled "Fluorine Micas" and describes research conducted on both natural and synthetic materials.

An article by E. G. Dingman in Society of Plastics Engineers Journal for September 1961, pp. 981-983, describes mica papers made from reconstituted, or integrated, natural micas, and use of such papers with resins in making laminates.

GENERAL DESCRIPTION OF THE INVENTION

A primary feature of our invention arises from the thermal expansion characteristics of boards or substrates produced by laminating resin-impregnated papers composed of ion-exchanged, synthetic, lithium and/or sodium, water-swelling micas. We have found that the coefficients of thermal expansion in such laminates are isotropic in a planar sense. That is to say, the coefficients along the X and Y axes are practically equal.

This is in marked contrast to most laminated boards or substrates presently used in electrical equipment. Thus, coefficients along the Y axis tend to be greater than those along the X axis, sometimes almost twice as great. It is speculated that this results from particle orientation in the paper and/or tension in fabric backings and reinforcements.

It is our belief that the isotropic expansion characteristics of our papers are occasioned by a planar orientation of mica platelets in the paper, that is a lack of any tendency to orient along the Z axis. We further believe this planar orientation is favored by a high aspect ratio in the mica platelets. Aspect ratio is the ratio of planar dimension to thickness. Hence, we employ synthetic, water-swelling micas that provide thin platelets, preferably with an aspect ratio in excess of 100. Further, the initial synthetic mica bodies self-disintegrate in water or other polar liquid to form the desired thin platelets, thereby avoiding the geometry degradation coincident with mechanical disintegration.

The thermal expansion characteristics become of significance when another material must be attached to a board surface. They become vital when the attachment is a thermal operation and/or when the attached product will subsequently be exposed to thermal changes. Thus, it may be necessary that the substrate be compatible with leadless ceramic chip carriers which are attached to the substrate board. Beryllia and alumina are frequently used carriers. In any case, a smooth substrate surface and matching isotropic expansion are highly desirable.

In this connection, we have further found that the absolute coefficient of thermal expansion in a laminated paper board in accordance with the invention can be on the order of $65 \times 10^{-7}/°C$. over a given temperature range, e.g., $-55°$ to $+120°$ C. Further, that value increases as the resin content in a mica-resin paper increases. Hence, the expansion can be controlled in this manner to provide a predetermined value below $100 \times 10^{-7}/°C$., and preferably in the range of 65 to $80 \times 10^{-7}/°C$.

In addition to the highly advantageous expansion coefficient feature just noted, substrates in accordance with the present invention have certain other advantages as well. In particular, the present materials may have superior dielectric strengths ranging up to 1100 V/mil and preferably greater than 800.

Another feature is of particular interest where holes must be drilled or punched to permit metallization for electrical conduction between circuit layers of a substrate, or between a pin and the hole wall. Heretofore, particularly where a glass fabric backing or reinforcement was used, drill wear was a severe cost factor. Further, when a hole wall must be plated, the presence of ragged fiber ends introduces an element of unreliability. Glass fabric reinforcement may also create a problem where a hole is to be punched in a substrate. Thus, the hole can't be punched without damaging or destroying the substrate in the process. Actual trials have demonstrated that the drilling and punching characteristics of a synthetic mica substrate are superior insofar as smoother hole wall surfaces are produced, thereby providing greater reliability in metallization for conductivity.

The present substrates are also advantageous to use because of their relative inertness to many standard processing solutions. For example, metal plating solutions have little or no effect. Likewise, photoresist materials may be employed and/or copper etching can be performed without appreciable injury to the substrate.

The electrical paper of the invention may be produced in any conventional manner. The usual technique is to employ the widely used Fourdrinier process where a slurry is fed over wires to a belt or web on which the paper sheet is withdrawn. The present procedure varies in that the sheet is formed from a synthetic mica, and in the manner of preparing the paper making slurry.

Preparation of the paper making slurry starts with production of a fully or predominantly crystalline body containing crystals of a synthetic, lithium and/or sodium, water-swelling mica as described in U.S. Pat. No. 4,239,519. To avoid repetition, the full disclosure of that patent is incorporated herein by reference. Briefly, the effective crystals are micas selected from the group composed of fluorhectorite, hydroxyl hectorite, boron fluorphlogopite, hydroxyl boron phlogopite, and solid solutions among those and between those and other structurally compatible species selected from the group of talc, fluortalc, polylithionite, fluorpolylithionite, phlogopite and fluorphlogopite. Preferred materials are synthetic hectorites and phlogopites, especially the hectorites, and detailed studies have been centered on this type of mica.

The mica may be produced by melting, cooling and crystallization to produce a glass-ceramic as disclosed in the reference patent. The crystalline product is added to a polar liquid, normally water, to swell and disintegrate into flakes or platelets. These disperse in the liquid to form a gel.

Alternatively, the mica may be produced by a solid state reaction in which a batch of suitably selected raw materials is heated at a sintering temperature on the order of 900° C. for sufficient time to react and recrystallize the batch, typically one to four hours. The reacted body may then be dispersed as before to produce a gel.

The synthetic mica gel thus produced is then brought in contact with a material containing a large exchangeable cation which may be organic or inorganic in nature. The conventional material used is a potassium chloride solution. However, as disclosed in U.S. Pat. No. 4,239,519, numerous cations greater in size than sodium and lithium may be employed. Likewise, complex organic cations may be employed, as disclosed in concurrently filed applications Ser. No. 461,571, filed in the names of S. N. Hoda and A. R. Olszewski and entitled "Organic-Inorganic Composites Containing Synthetic Mica", now U.S. Pat. No. 4,454,237 and Ser. No. 461,672 filed in the name of S. H. Wu and entitled "Organic-Inorganic Composites of Neutralized Polyelectrolyte Complexes", now U.S. Pat. No. 4,455,382. The large cation, whether organic or inorganic, exchanges with lithium and/or sodium ions from the mica, thereby flocculating the gel.

The floc thus produced is separated, as by draining, and washed to remove salts which might be detrimental to electrical properties. The floc is then redispersed in a predetermined quantity of water with an addition of up to 15% or so of chopped glass fibers if desired. The latter serve to improve wet strength and to facilitate water drainage during paper formation. The slurry thus provided is then fed to a conventional paper making machine in the usual manner. The paper is then dried for further processing.

The dried paper is now exposed to a resin solution. This impregnates the paper, and, in the case of board production, prepares it for stacking and lamination. The resin selected will depend on desired properties. An epoxy system has been studied most fully, and provides a basis for the specific description that follows. Other systems found effective include phenolic, polyester, polyimide and polyetherimide, and it is believed any thermoset or thermoplastic resin might be used.

Typically, the resin system will consist of the resin, such as epoxy, a known solvent, such as acetone, and minor amounts of a coupling agent and a curing agent. These will be selected from materials known for the respective purposes.

The amount of resin introduced depends on a number of factors, and may be readily controlled. It has been indicated that the thermal expansion coefficient of a laminated substrate increases with resin content. Hence, the amount of resin may be limited depending on the coefficient required.

Another factor is the capability of a paper to take up resin. Thus, in general, the denser the paper, the less resin it can take up. It is believed a denser paper has less pores in which to receive resin.

A further factor is the ultimate use of the impregnated paper. Thus, so-called prepregs designed for bonding, may have relatively high resin contents. This facilitates tight bonding, and may have little overall influence on expansion coefficient. Likewise, laminations are envisioned wherein B-staged sheets may vary in resin content to impart specific properties.

In general, the present impregnated papers should contain at least 15% resin, and may contain up to 75%. In order to maintain expansion coefficients below $100 \times 10^{-7}/°C.$, an average resin content in the range of 20 to 50% is preferred.

A variety of different curing agents may be used with epoxy resins. These may be categorized as amines, acid anhydrides and catalytic.

Among the amine curing agents are aliphatic amines such as tetraethylene pentamine. A typical aromatic is methylene dianiline. Another commonly used is aminoethylpiperazine. These are room temperature curing agents which are frequently unsuitable if resistance to elevated temperature is a requirement.

The acid anhydride curing agents may be used where service at elevated temperatures is contemplated and where good electrical properties are required. Among those useful here are nadic methyl anhydride and pyromellitic dianhydride.

The catalytic curing agents are widely used in electrical applications because of their stability, particularly at elevated temperatures, and the small amount needed. The most commonly used is dicyandiamide which may be used with an accelerator such as benzyl dimethylamine to speed the cure. Boron trifluoride ethylamine complex is another useful curing agent of this type.

Coupling agents useful for epoxy resin-mica crystal coupling are silanes and titanates. The functional groupings on silanes include glycidoxy, polyamine, vinylamine and a simple amine. The titanates may be of a monoalkoxy, an oxyacetate chelate, or a quaternary type.

The paper may be thoroughly impregnated by soaking in the resin solution for a period of time normally not exceeding one hour. It is then removed, rinsed and dried, preferably with mild heating, for example, by passing through an oven at 125° C.

It has already been mentioned that papers may be impregnated to form either prepregs or B-staged sheets for lamination. In either case, the impregnated sheet will be partially cured, that is will be cured sufficiently to remove tackiness. However, it must still admit of sufficient higher temperature curing so that the ultimate bonding required for lamination may be attained. Thus, the sheet may be initially heat treated at 125°–150° C., and then subsequently laminated under pressure at a temperature 50° C. or so higher. In the interim, the impregnated sheets may be held in storage if desired.

Thereafter, if board is to be made, a plurality of sheets will be stacked and laminated to form an integral body. Thus, a stack may be further heated at 175° C. for an hour while under pressure of about 500 psi.

In stacking the papers for consolidation, the sheets may be interleaved or clad with a conductive material such as copper if desired. The number of sheets in a stack will depend on paper thickness and desired board thickness. For example, typical laminae thicknesses in a laminated board are in the range of 3 to 5 mils and total board thickness may range from 4 to 500 mils. One commonly used size is 62 mils and may employ 15 sheets of paper 4 mils thick in the laminated substrate.

The board or substrate formed by lamination may then be provided with conductive metal circuitry. This may be supplied by subtractive or additive techniques such as chemical electrolytic deposition, electroless/catalytic deposition, printing, chemical etching, physical pressing, vacuum deposition or vacuum sputtering. The circuitry may be present on the board surface, plated or contained in board holes, or buried internally such as in a multilayered circuit board.

A plurality of printed circuit boards, having desired circuit patterns formed on their surface, may be combined in a multilayered board with at least part of the circuitry being buried internally. To unite such circuit boards, it is usually desirable to employ, for bonding purposes, a prepreg which may have a relatively high resin content.

SPECIFIC DESCRIPTION OF THE INVENTION

EXAMPLE A

A glass-ceramic material, composed predominantly of lithium fluorhectorite crystals, was prepared from a glass having the following formulation: 64.5% $SiO_2$, 10.8% $MgO$, 8.0% $Li_2O$, and 16.7% $MgF_2$. This material was placed in water where it underwent swelling and disintegration into thin platelets. The platelets had a high aspect ratio and formed a gel with the liquid. This gel was then introduced into a potassium chloride solution to break the gel, exchange potassium for lithium ions, and separate the potassium-ion-exchanged hectorite as floc. The floc was rinsed, dried, and then redispersed in water to produce a slurry suitable for papermaking. This slurry had a solids content of about 10% by weight. The slurry further contained chopped glass fibers in amount such as to constitute about 15% in paper drawn from the slurry. A 36" wide, continuous sheet of paper, approximately 5 mils thick, was drawn by a standard Fourdrinier process. The sheet was cut into 6" squares for subsequent treatment, the squares being divided into lots of 15 sheets each for consolidation into boards.

An epoxy polymer, available from Dow Chemical Company, Midland, Mich. under the designation DER 331, was mixed with dicyandiamide as curing agent and gamma-glycidoxypropyl trimethoxy silane (Z6040) as coupling agent. The curing agent was added in the proportion of six (6) parts by weight per hundred parts of resin (phr) and the coupling agent in amount of two (2)%. Then tetrahydrofuran (THF) was added as solvent to provide a 30% epoxy solution, the total being about 200 grams. Each sheet of the synthetic mica paper was submerged in the solution and allowed to soak for four (4) hours. The sheets were then removed and dried in air for four (4) hours.

Fifteen sheets of the soaked and dried papers were stacked in registry and placed between steel plates lined with a tetrafluorethylene coating. A pressure of 200 psi was applied while the stack was cured at 175° C. for two (2) hours. The cured board was cooled under pressure and given a post cure overnight at 125° C.

EXAMPLE B

The foregoing procedure was repeated, except that a series of solutions varying in epoxy content from one to 30% was employed. Each sheet was dipped in the one % solution, dried, and then progressively dipped in the increasingly concentrated solutions and dried between dips.

EXAMPLE C

The initial procedure was again repeated, except that the papers were dried at 300° C. before soaking.

EXAMPLE D

Finally, the modified procedure, wherein progressively concentrated solutions were employed, was repeated with papers dried at 300° C. before dipping.

The initial procedure was again repeated, except that different epoxy curing agents were employed. In the first case (Example A-1), 46 phr of pyromellitic dianhydride were substituted for the dicyanamide as the curing agent. In the second case (Example A-2), 26 phr methylene dianiline were substituted as curing agent.

TABLE I, below, sets forth properties measured on the six examples described above and identified by their curing conditions as A, B, C, D, A-1 and A-2. Flexural strength is measured in pound/in.$^2$ (psi) in accordance with ASTM D790. Tensile strength is in the same units and measured in accordance with ASTM D229-77. Thermal expansion is measured in units per °C. in accordance with ASTM D696, and the actual values are the values given multiplied by $10^{-7}$. Note that both the flexural and tensile strengths of the present materials are generally above comparable values for a control sample without epoxy, those values being generally less than five thousand psi. Also, note the consistently low thermal coefficient of expansion.

TABLE I

| Example | A | B | C | D | A-1 | A-2 |
|---|---|---|---|---|---|---|
| Flexural strength, psi | 16,000 | 15,000 | 8,700 | 12,100 | — | 5,600 |
| Tensile strength, psi | 11,500 | 15,300 | 8,000 | 7,600 | 7,500 | 9,700 |
| Expansion X-Y × $10^{-7}$/°C. | 65 | 77 | 78 | 71 | — | — |

TABLE II records measurements made on a series of laminated substrates prepared in accordance with procedures described in Example A. The several substrates differ in the percentage of epoxy introduced. This figure was based on weight measurements before impregnation and after curing, the percentage being the increase during impregnation divided by the total final weight. Moisture absorption is measured according to D1825 and is the percent gain by weight from immersion in water at room temperature for 24 hours. Dielectric constant (DC) and dissipation factor (LT) were measured according to ASTM D150 using 1" diameter, vapor deposited gold electrodes. It will be appreciated that thermal coefficients of expansion (CTE) generally increase with resin content, but are also somewhat dependent on a number of other factors as well.

TABLE II

| Sample | % Epoxy | % H$_2$O Absorbed | CTE | MOR | LT | DC |
|---|---|---|---|---|---|---|
| 1 | 18 | 0.7 | 65–70 | 28,600 | .05 | 4.6 |
| 2 | 20 | 0.7 | 65–70 | 37,200 | .05 | 5.4 |
| 3 | 25 | 0.7 | — | 38,500 | .017 | 5.3 |
| 4 | 28 | 1.5 | 70–80 | 32,800 | .016 | 5.1 |
| 5 | 47 | 0.6 | 106–120 | 23,500 | .015 | 4.8 |
| 6 | 50 | 0.54 | 95–105 | 32,400 | .016 | 5.2 |
| 7 | 54 | 0.3 | 84–96 | 19,800 | .05 | 4.1 |
| 8 | 70 | 0.66 | 175–185 | 14,200 | .018 | 5.3 |

By way of further illustrating suitability of the present materials for printed circuit board production, TABLE III, below, compares typical properties measured on boards prepared in accordance with the present invention with properties measured on fabric-reinforced boards presently used commercially. The first column is based on a 25% epoxy substrate, that is 25% epoxy and 75% ion-exchanged mica. The second column values are based on a 50% epoxy-50% mica substrate. Columns 3–6 set forth properties for commercially available boards characterized by a glass fabric reinforcement. Perpendicular dielectric strength was measured in silicone oil due to arcing in air. Volume resistivity was measured according to D257.

TABLE III

| Example | 1 | 2 | 3 | 4 | 5 | 6 |
|---|---|---|---|---|---|---|
| Generic Type | Epoxy-Mica (25-75) | Epoxy-Mica (50-50) | Epoxy | Phenolic | PTFE | Polyimide |
| Reinforcement | — | — | Glass Fabric | Paper | Glass Fabric | Glass, polyimide |
| Flex. str. MD, psi | 35,000 | 30,000 | 80,000 | 21,000 | 15,000 | 97,000 |
| Flex. Mod. MD, psi | 3.8 × 10$^6$ | — | 2.8 × 10$^6$ | 1.2 × 10$^6$ | — | — |
| Impact, edgewise, ft/lb in | 0.3–2 | — | 10.0 | .4 | — | — |

TABLE III-continued

| Example | 1 | 2 | 3 | 4 | 5 | 6 |
| --- | --- | --- | --- | --- | --- | --- |
| Thermal Exp., $\times 10^{-7}/°C$. | 60–65 | 90–100 | 180 | 216 | 182 | 180 |
| Dielec. str., v/mil | 1,100 | >850 | 500 | 700 | 1,125 | — |
| K' ($10^6$Hz) | 5.1 | 4.6 | 4.2 | 4.1 | 2.54 | 4.3 |
| Tan ($10^6$ Hz) | 0.018 | 0.02 | .018 | .026 | .0008 | .011 |
| Vol. Resis., ohm-cm | $>10^{13}$ | $>10^{13}$ | $5 \times 10^{12}$ | — | $1 \times 10^{12}$ | $5 \times 10^{15}$ |
| Water Absorp., wt % | 0.5 | 0.3–0.5 | 0.10 | 0.4 | 0.05 | .16 |

The following examples illustrate diversity of the invention.

EXAMPLE E

Ten sheets of an ion-exchanged, synthetic mica paper were prepared as described earlier in Example A.

After drying, each sheet was placed in a 50% solution of a polyester resin in tetrahydrofuran. The resin is available from Koppers Co., Pittsburgh, Pa. under designation, V7001-10.

Each sheet was thoroughly impregnated, then removed and dried. The dried sheets were stacked and the stack heated at 175° C. for about one minute under contact pressure. The pressure was increased to about 500 psi and the stack held at that temperature and pressure for 35 minutes. The stack was then cooled to room temperature and removed from the press.

EXAMPLE F

Ten sheets of an ion-exchanged, synthetic mica paper were prepared as above. The dried sheets were placed in a 50% solution of a phenolic resin in ethanol. The resin is available from Hooker Chemical under the designation, "Durez 12763".

After saturation with the resin, the sheets were removed and dried. The impregnated sheets were then stacked and heated under a pressure of about 500 psi at a temperature of 175° C. for a period of one hour. The laminated stack was then cooled to room temperature.

EXAMPLE G

A glass-ceramic material, composed predominantly of mixed lithium-sodium fluorhectorite crystals, was prepared from a glass having the following formulation: 60.8% $SiO_2$, 22.9% MgO, 3.8% $Li_2O$, 2.6% $Na_2O$, and 9.7% F. This material was placed in water to disintegrate into thin platelets having a high aspect ratio. The gel thus formed was then treated with a potassium chloride solution to effect an exchange between the potassium ions and the sodium and lithium ions in the mica crystals. This flocculated the gel, and the floc, composed of potassium-ion-exchanged hectorite, was separated from the liquid. After careful rinsing to remove salts, the floc was dried and redispersed in water in about a ten percent ratio to produce a slurry for papermaking. Chopped glass fibers were introduced as before to facilitate the papermaking process, and paper drawn from the slurry. The paper was dried and cut into sheets for subsequent processing.

Twelve (12) sheets of the paper were fully soaked in a 10% solution of a catalyzed epoxy resin available from Dow Chemical under the designation XD9066.02. The sheets were removed from the solution, heated at 150° C. for four (4) minutes, and this soaking and drying cycle repeated. After the second drying at 150° C., the sheets were immersed in a 50% solution of the resin. When fully soaked, the papers were removed and again dried at 150° C. for four (4) minutes.

The impregnated sheets were then stacked and subjected to a pressure of 100 psi at room temperature. The temperature was raised to 130° C. without pressure change and held for 30 minutes. The pressure was then increased to 200 psi while the temperature was increased to 200° C., and these conditions maintained for 45 minutes. The laminated stack was then cooled to room temperature and removed from the press. The coefficient of thermal expansion was measured and a value of $100-105 \times 10^{-7}/°C$. was observed.

We claim:

1. A substrate in which a plurality of synthetic mica papers impregnated with an organic resin are laminated together to produce a planar isotropic coefficient of thermal expansion in the X-Y plane, each paper being composed of overlapping, ion-exchanged platelets of a synthetic, lithium and/or sodium, water-swelling mica wherein lithium and/or sodium ions from the mica have been exchanged for larger cations, said mica platelets having a high aspect ratio and a planar orientation.

2. A substrate in accordance with claim 1 in which the impregnating resin constitutes 20 to 50% of the impregnated paper.

3. A substrate in accordance with claim 1 in which the mica is selected from the group composed of fluorhectorite, hydroxyl hectorite, boron fluorphlogopite, hydroxyl boron phlogopite, and solid solutions among those and between those and other structurally compatible species selected from the group of talc, fluortalc, polylithionite, fluorpolylithionite, phlogopite and fluorphlogopite.

4. A substrate in accordance with claim 1 wherein at least one of the laminated mica papers contains up to 75% resin.

5. A substrate in accordance with claim 1 wherein conductive circuit patterns are buried between laminae.

6. A substrate in accordance with claim 1 in which one or more holes are produced through the substrate and the hole walls are metallized.

7. Synthetic mica papers impregnated with an organic resin and consisting essentially of overlapping ion-exchanged platelets of a synthetic lithium and/or sodium water-swelling mica, wherein lithium and/or sodium ions from the mica have been exchanged for larger cations, said mica platelets having a high aspect ratio and a planar orientation such that said papers can be stacked and consolidated to produce a laminated substrate having a planar isotropic coefficient of thermal expansion in the X-Y plane.

8. Synthetic mica papers according to claim 7 wherein the organic resin constitutes 15-75% of said papers.

9. Synthetic mica papers according to claim 7 wherein the organic resin is an epoxy.

10. Synthetic mica papers according to claim 7 also containing a coupling agent for the mica platelets and the organic resin.

11. Synthetic mica papers according to claim 10 wherein said organic resin is an epoxy and said coupling agent is selected from the group of silanes and titanates.

12. Synthetic mica papers according to claim 1 also containing a curing agent for the organic resin.

13. Synthetic mica papers according to claim 12 wherein said organic resin is an epoxy and said curing agent is selected from the group of amines, acid anhydrides, and catalytic.

14. Synthetic mica papers in accordance with claim 7 wherein the mica is selected from the group composed of fluorhectorite, hydroxyl hectorite, boron fluorphlogopite, hydroxyl boron phlogopite, and solid solutions among those and between those and other structurally compatible species selected from the group of talc, fluortalc, polylithionite, fluorpolylithionite, phlogopite, and fluorphlogopite.

15. Synthetic mica papers in accordance with claim 7 wherein the larger exchanged ions are selected from the group of complex organic cations and potassium ions.

16. Synthetic mica papers in accordance with claim 7 wherein the mica platelets have an aspect ratio of at least 100.

17. Synthetic mica papers in accordance with claim 7 wherein the planar coefficient of thermal expansion in a laminated stack is less than $100 \times 10^{-7}/°C$.

* * * * *